United States Patent [19]

Mitamura

[11] 4,270,119
[45] May 26, 1981

[54] DUAL SLOPE SYSTEM A-D CONVERTER

[75] Inventor: Masakazu Mitamura, Gyoda, Japan

[73] Assignee: Takeda Riken Kogyo Kabushikikaisha, Tokyo, Japan

[21] Appl. No.: 56,630

[22] Filed: Jul. 11, 1979

[30] Foreign Application Priority Data
Jul. 14, 1978 [JP] Japan .................................. 53-86511

[51] Int. Cl.³ .......................................... H03K 13/20
[52] U.S. Cl. ..................... 340/347 NT; 340/347 AD; 340/347 M; 340/347 CC; 324/99 D; 73/362 AR
[58] Field of Search .... 340/347 M, 347 NT, 347 AD, 340/347 CC; 324/99 D, 78 D, 78 E; 73/362 AR

[56] References Cited
U.S. PATENT DOCUMENTS

| 3,942,123 | 3/1976 | Georgi | 340/347 NT X |
| 3,987,435 | 10/1976 | Ikeda | 340/347 NT |
| 4,107,667 | 8/1978 | Kronlage | 340/347 NT |

Primary Examiner—Thomas J. Sloyan
Attorney, Agent, or Firm—Staas and Halsey

[57] ABSTRACT

In an A-D converter of a dual slope system, a digital value set by setting means is provided to switch drive signal generating means to derive therefrom a switch drive signal of a time width corresponding to the digital value, and by the switch drive signal a switch is turned ON, through which a constant voltage is superimposed on an analog input voltage.

11 Claims, 11 Drawing Figures

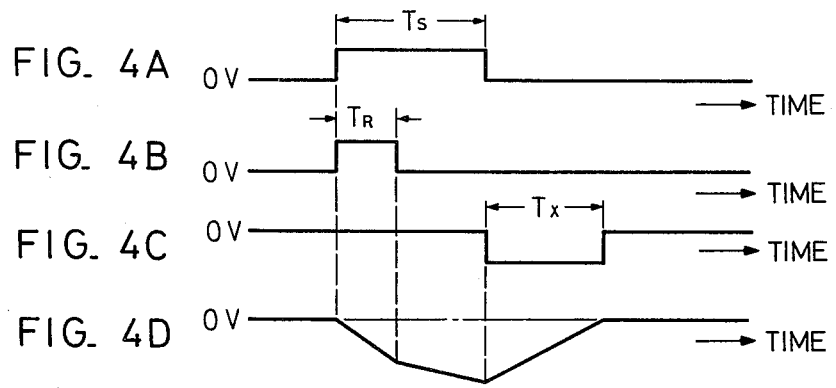
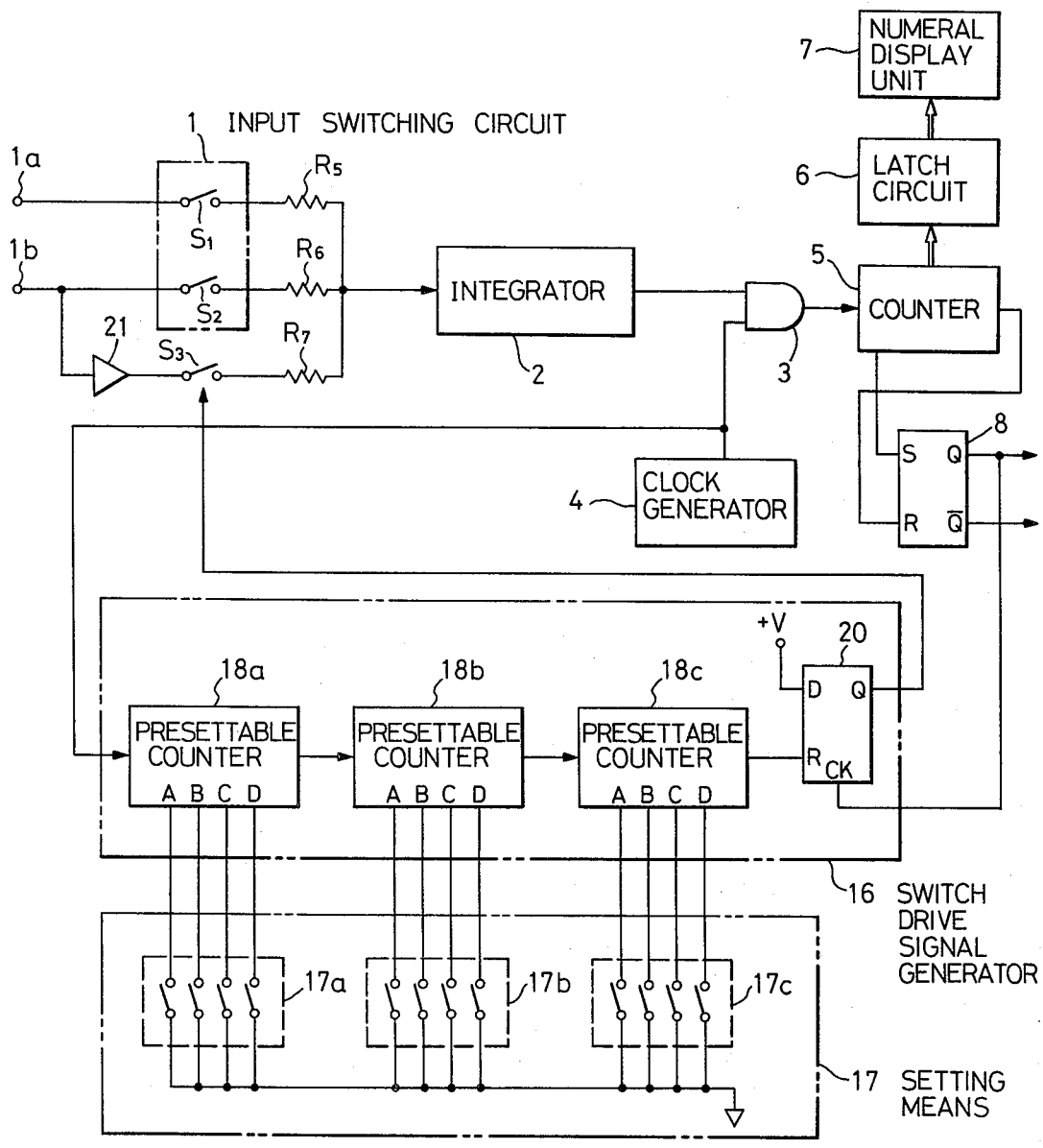
FIG. 5

DUAL SLOPE SYSTEM A-D CONVERTER

BACKGROUND OF THE INVENTION

This invention relates to a converter for converting an analog input voltage into a digital value by a dual slope system, and more particularly to an A-D converter which is adapted so that an output digital value can be changed, as required, with respect to the same analog input voltage.

An A-D converter of the dual slope system is disclosed, for example, in U.S. Pat. Nos. 3,316,547 issued Apr. 25, 1967 and 4,110,746 issued Aug. 29, 1978. At present, an output voltage of a thermocouple is displayed in digital form using such an A-D converter. The thermocouple usually holds a reference junction temperature at 0° C., and when the temperature of an object to be measured is 0° C., the output voltage of the thermocouple becomes 0 V to display 0° C. In the case of displaying the measured temperature in terms of absolute temperature, with the reference junction temperature held at 0° C., it is necessary to add a bias voltage to the thermocouple output so that 273.15 K is displayed at 0° C. To perform this, it is the practice in the prior art to divide a constant voltage by a resistance-type potential divider circuit and select one of the voltage-divided outputs as the bias voltage to the thermocouple output. The resistance-type potential divider circuit has the defect that it requires expensive resistors of high-precision resistance values and unsusceptible to a temperature change.

SUMMARY OF THE INVENTION

An object of this invention is to provide an A-D converter which permits a desired addition or subtraction with respect to an output digital value without using any resistance-type potential divider circuit.

Another object of this invention is to provide an A-D converter which can easily be arranged using an A-D converter fabricated as a semiconductor integrated circuit, now on the market.

Still another object of this invention is to provide an A-D converter in which the time for conversion can be made short when the change in an analog input value is small.

According to this invention, in an A-D converter of the dual slope system a constant voltage is superimposed on an analog input voltage in a first integration period for a time corresponding to an arbitrarily settable digital value. That is, in the A-D converter of the dual slope system the analog input voltage is integrated by an integrator for a certain period of time, i.e. in a first integration period, a reference voltage opposite in polarity to the analog input voltage is integrated by the integrator until the integrated output therefrom becomes equal to a value at the beginning of the first integration period, and then the period of the second integration is converted into a digital value. With the present invention, a correction value for the output digital value is set as a digital value by setting means, and the digital value is applied to switch drive signal generating means to derive therefrom a switch drive signal of a time width corresponding to the digital value. By the switch drive signal, a switch is controlled in the first integration period to permit a constant voltage to be superimposed on the analog input voltage while the switch drive signal lasts. The switch drive signal generating means is provided, for example, with a counter, and the digital value from the setting means is set in the counter before the first integration period, and then the counter is caused to start its counting operation at the beginning of the first integration period. Having counted clock pulses of a number equal to the set digital value, the counter yields an output, and the switch drive signal is produced which has the time width corresponding to the time interval from the moment of the counter starting its counting operation to the moment of the counter producing the output. Therefore, by changing the digital value to be set by the setting means, the output digital value can be altered; accordingly, there is no need of generating various bias voltages from resistance-type potential dividers. That is, no expensive resistors of high precision and high stability are needed.

BRIEF DESCRIPTION OF THE DRAWINGS

FIG. 4 (A–D) is a timing chart explanatory of the operation of the A-D converter shown in FIG. 3;

FIG. 5 is a block diagram illustrating another embodiment of the A-D converter of this invention which employs presettable counters in switch drive signal generating means;

DESCRIPTION OF THE PREFERRED EMBODIMENTS

Figure 1:
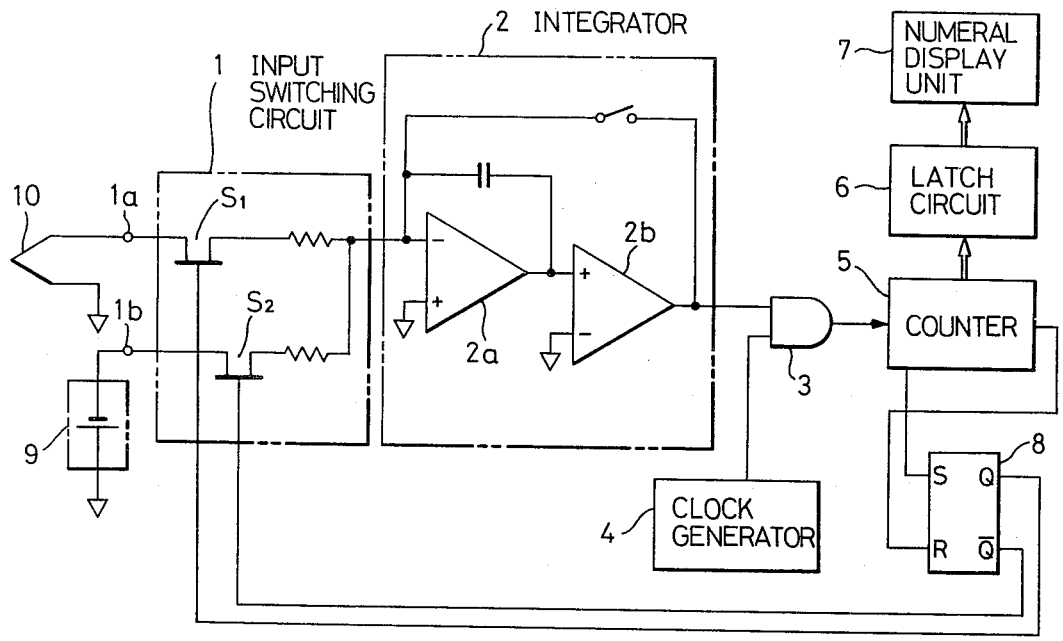
FIG. 1 is a block diagram showing an A-D converter of the dual slope system which is usually employed in the art.

Referring first to FIG. 1, a description will be given of a conventional A-D converter for use in a digital thermometer. The A-D converter comprises an input switching circuit 1, an integrator 2, a gate circuit 3, a clock generator 4, a counter 5, a latch circuit 6, a numeral display unit 7, a flip-flop 8 for controlling the input switching circuit 1, and a reference voltage source 9. Connected to one input terminal 1a of the input switching circuit 1 is, for example, to thermocouple, and connected to the other input terminal 1b is the reference voltage source 9. In the input switching circuit 1 a FET switching element $S_1$ is turned ON first, through which an analog input voltage, i.e. a voltage from the thermocouple 10 to be measured in this example, is applied to the integrator 2 for integration. The time for integration of the voltage to be measured is predetermined to be constant. For the determination of this integration, use is made of the counter 5, for example, That is, the integration time is defined by the time from the moment of start of counting by the counter 5 from its reset state to the moment of an overflow; namely, the flip-flop 8 is set by a count start signal of the counter 5, and the output Q of the flip-flop 8 is applied to a control terminal of the switching element S₁ to turn it ON. The counter 5 counts clock pulses derived from the clock generator 4, and by an overflow signal of the counter 5, the flip-flop 8 is reset. The output $\bar{Q}$ from the flip-flop 8 is provided to a control terminal of a FET switching element S₂ of the input switching circuit 1.

When the flip-flop 8 is reset, the switching element S₁ is restored to its OFF state, and instead the switching element S₂ is turned ON. Upon turning ON the switching element S₂, a constant voltage opposite in polarity to the voltage to be measured is supplied to the integrator 2 for integration; consequently, the integrated output from an integration circuit 2a in the integrator 2 varies in a direction reverse to that of integration of the voltage to be measured after switching between the switching elements S₁ and S₂. When the integrated voltage has returned to a predetermined value, for example, a voltage of a common potential point, i.e. 0 volt, the output from a voltage comparator 2b supplied with the output from the integration circuit 2a becomes zero or negative to close the gate circuit 3. As a result of this, the counter 5 provides a count value which is proportional to the time interval between turning ON of the switching element S₂ and the closing of the gate circuit 3. This count value is proportional to the magnitude of the voltage to be measured, that is, an analog input voltage. The count value of the counter 5 is latched by the latch circuit, whose output is applied to the display unit 7 to provide a display of a temperature value or input valve. The periods during which the analog input voltage and the reference voltage are integrated are referred to as a first and a second integration period respectively, and such an A-D conversion system is called a dual slope system.

The thermocouple 10 is usually adapted so that its reference junction temperature remains at 0° C. and that its output voltage becomes 0 V to indicate 0° C. when the temperature of an object to be measured is 0° C. For providing the display, for example, in terms of absolute temperature holding the reference junction temperature at 0° C., it is necessary to add to the thermocouple output a bias voltage corresponding to the absolute temperature, i.e. 273.15 K. Also in the case of producing a Fahrenheit temperature display, such a bias voltage is needed, and also in other cases, for example, when the reference junction temperature is set to a value other than 0° C., the bias voltage must be supplied.

Figure 2:
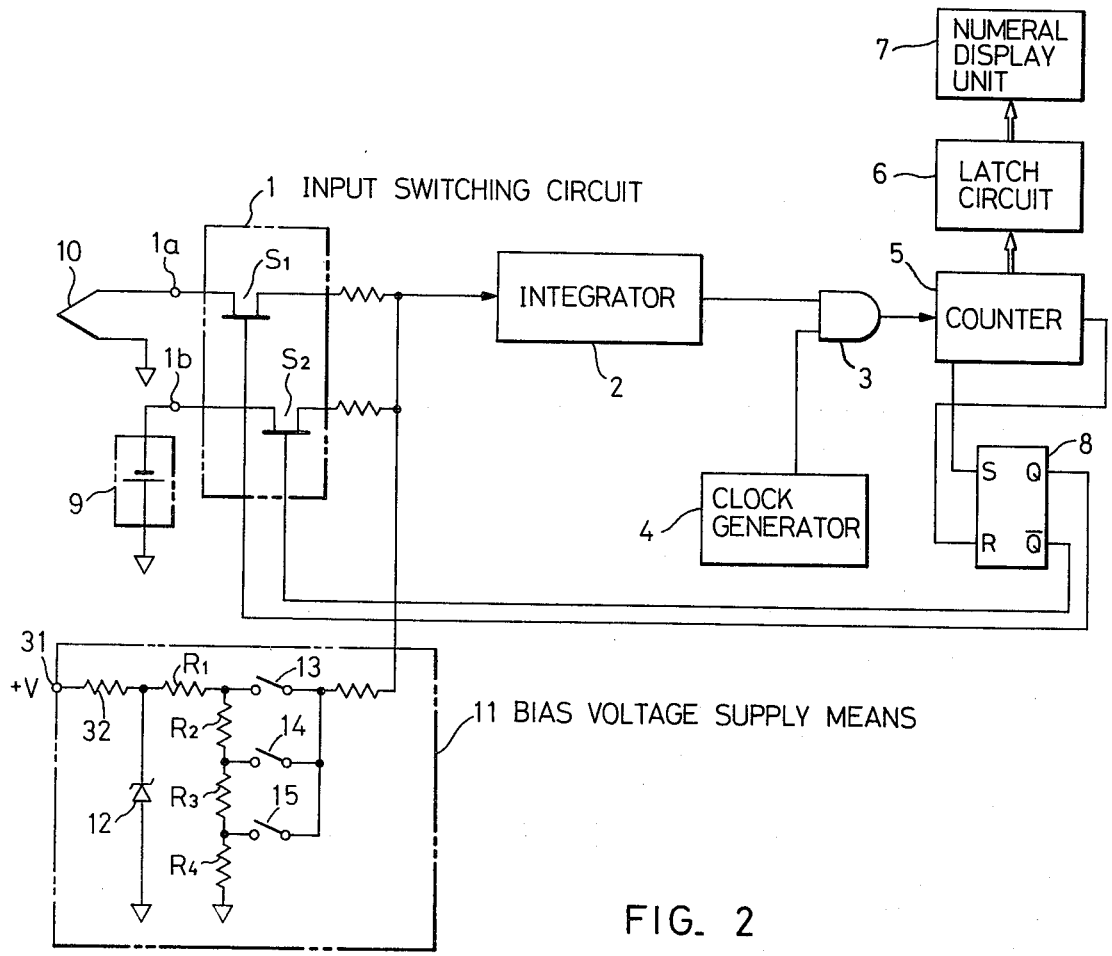
FIG. 2 is a block diagram illustrating an A-D converter provided with bias generating means as correcting means heretofore employed.

To this end, the prior art employs bias voltage supply means 11, as shown in FIG. 2, and supplies therefrom a predetermined bias voltage to the input side of the integrator 2 so that the temperature display can be modified.

The bias voltage derived from the bias voltage supply means 11 must be stable and accurately determined. To meet this requirement, a voltage $+V$ of a terminal 31 is applied via a resistor 32 to a Zener diode 12 to obtain a stabilized voltage, which is voltage divided by resistors R₁, R₂, R₃, and R₄, and the voltage-divided voltages are selectively taken out by select switches 13, 14 and 15 to be supplied to the input side of the integrator 2.

The resistors R₁, R₂, R₃ and R₄ making up the voltage divider circuit are required to be highly precise resistors whose resistance values are precisely defined down to several places of decimals for obtaining a predetermined voltage. In addition, the temperature coefficients of these resistors R₁ to R₄ must be small; therefore, the resistors are inevitably expensive. On top of that, fabrication of such resistors of predetermined resistance values is troublesome and costly.

Figure 3:
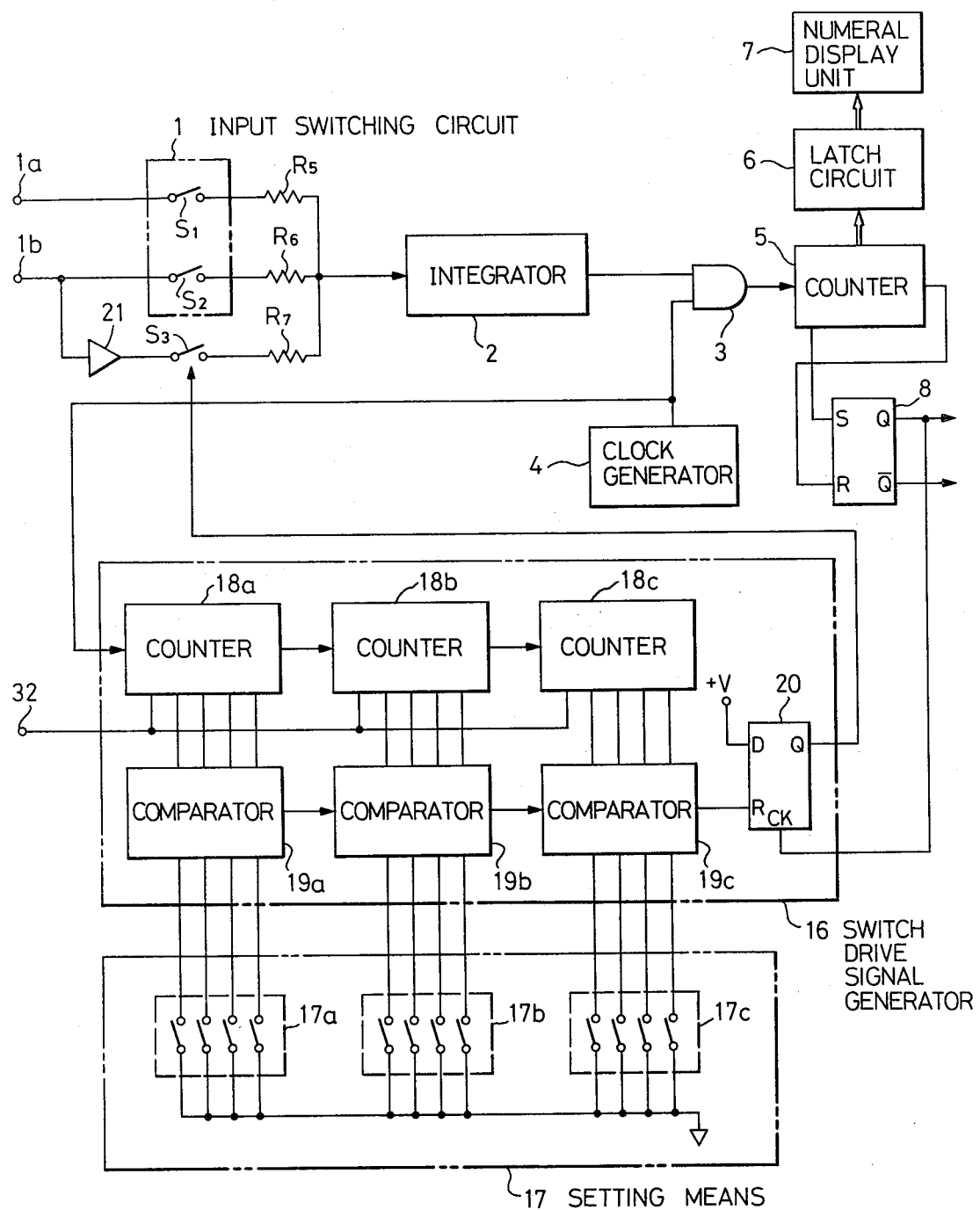
FIG. 3 is a block diagram showing an embodiment of an A-D converter of this invention.

FIG. 3 illustrates an embodiment of an A-D converter of the present invention. In FIG. 3, parts corresponding to those in FIGS. 1 and 2 are identified by the same reference numerals, and no description will be repeated for these elements. In accordance with this invention, there are provided digital value setting means 17 for setting a digital value and switch drive signal generating means 16 for generating a switch drive signal of a duration corresponding to the digital value. The digital value setting means 17 comprises switch groups 17a, 17b and 17c, each group comprising four switches, which are weighted on a binary-coded decimal code basis so that a value of one digit of a decimal number is set therein. In the illustrated example, a decimal number of three figures can be set as a digital value by setting the ON-OFF operation of each switch. In the switch drive signal generating means 16 there are provided decimal counters 18a, 18b and 18c respectively corresponding to the switch groups 17a, 17b and 17c, the counters 18a to 18c being connected in cascade. Accordingly, counting 0 to 999 can be performed by the three counters 18a through 18c. The counters 18a to 18c are reset via a terminal 32 for each A-D conversion, for example, upon initial setting of the integrator 2, such as resetting of it, and the counters are released from their reset state at the beginning of the aforesaid first integration period. Of the counters 18a to 18c, the counter 18a of the first stage is supplied with clock pulses from the clock generator 4, and the clock pulses are counted by the counters 18a to 18c. The count values of the counters 18a to 18c and the digital values set in the switch groups 17a to 17c are provided to comparators 19a through 19c respectively, and in the case of coincidence between the values in all of the comparators, the comparator 19c of the last stage provides a coincidence signal. This coincidence signal is applied to a D flip-flop 20 to reset it. The D flip-flop is always supplied at its data terminal D with a positive voltage and at its clock terminal CK with the output Q of the flip-flop 8. Accordingly, when the output as a terminal Q of the flip-flop 8 rises at the start of the first integration period, the D flip-flop 20 provides logic "1" at its terminal Q. Until the D flip-flop 20 is reset by the coincidence signal from the comparator 19c, the output at the terminal Q remains to be logic "1", providing a switch drive signal; thus, the D flip-flop 20 together with counters 18a-c and comparators 19a-c form a switch drive signal generator.

A switch S₃ is provided for adding a constant voltage to the analog input voltage while the switch drive signal is being yielded. The switch S₃ is, for example, a FET switching element, as is the case with the switches S₁ and S₂, and supplied at its gate terminal with the output Q of the D flip-flop 20. Consequently, the switch S₃ is turned ON at the start of the first integration period and held in the ON state until the counters 18a to 18c count the set value. In the illustrated example, the constant voltage to be superimposed on the analog input signal is derived from the reference voltage source 9 (FIG. 1), and the reference voltage fed to the terminal 1b is polarity inverted by a polarity inverting amplifier 21, and the polarity-inverted voltage is supplied to the input side of the integrator 2 via the switch S₃ and a resistor R₇. Thus, while the switch S₃ is in the ON state, a constant voltage of the same polarity as the analog input voltage at the terminal 1a is applied to the integrator 2.

By applying the voltage of the same polarity as the analog input voltage to the integrator 2 for the period of time corresponding to the digital value set inthe switch groups 17a to 17c, as described asbove, the value set in the switch groups 17a to 17c can be added to the numerical value that the analog input voltage is converted into digital form. In the case where a voltage opposite in polarity to the analog input voltage is applied via the switch $S_3$ to the integrator 2 while the switch $S_3$ is in the ON state, the result is that the set value is subtracted from the numercial value that the analog input voltage is converted into digital form.

FIG. 4 shows a series of waveforms explanatory of the operation of the A-D converter produced according to this invention. FIG. 4A shows the output signal at the terminal Q of the flip-flop 8, and the pulse width $T_S$ of this signal is indicative of the first integration period. FIG. 4B shows the output signal at the terminal Q of the D flip-flop 20, that is, the switch drive signal, and during the pulse width $T_R$ of this signal the switch $R_3$ is in the ON state. While the switch $S_3$ remains in the ONE state, the voltage of the same polarity as the analog input voltage is supplied to the integrator 2, so that while the integration of the integrated output voltage from the integrator 2 is steep it becomes less steep after turning OFF switch $S_3$, as shown in FIG. 4D. FIG. 4C shows a control signal for determining the second integration period $T_X$.

Letting $E_i$ represent the analog input voltage, $E_s$ the reference voltage applied to the intergrator 2 in the second integration period, $E_R$ the constant voltage applied via the switch $S_3$ to the integrator 2 and $T_R$ the time during which the switch $S_3$ remains in the ON state and assuming that input resistors $R_5$, $R_6$ and $R_7$ of the integrator 2 have the same resistance value, the following relationship is established:

$$E_i T_S + E_R = E_S \cdot T_X \quad (1)$$

In this case, assuming that the reference voltage $E_R$ is produced by the inverting amplifier 21, $E_R = -E_S$, and consequently it follows that $$E_i \cdot T_s + (-E_S) \cdot T_R = E_S \cdot T_X \quad (2)$$

$$T_X = (E_i / E_S) \cdot T_S - T_R \quad (3)$$

Namely, the time $T_R$ during which the switch $S_3$ is held in the ON state is added to the time $T_X$ corresponding to the second integration period, available in the counter 5, unlike the second integration period of the A-D converter of FIG. 1 in which no constant voltage is added. The time $T_R$ is set digitally by time converting means 16 and hence can accurately be set to a desired value.

Thus, the present invention permits addition of a desired numerical value to the A-D conversion result in the A-D converter of the dual slope system. In the case where the voltage to be applied via the switch $S_3$ to the integrator 2 is made opposite in polarity to the analog input voltage, the set numerical value can be subtracted from the A-D conversion result. Therefore, the present invention does not necessitate the use of the conventional bias voltage supply means 11, i.e. precision resistors mentioned previously with regard to FIG. 1 but provides an A-D converter arrangement capable of performing highly accurate display modifications without any adjustment.

FIG. 5 illustrates another embodiment of this invention, which employs presettable counters as the counters 18a to 18c making up the switch drive signal generating means 16 and in which the switch groups 17a to 17c of the setting means 17 are connected to preset terminals A, B, C and D of the counters respectively. In the initial setting for each A-D conversion, the digital values set in the switch groups 17a to 17c are preset in the counters 18a to 18c; in this case, the values preset in the switch groups are complements of the digital values set in the counter. As a consequence, when the counters 18a to 18c have counted clock pulses equal in numbers to the set values of the switch groups 17a to 17c, the final-stage counter 18c provides an overflow signal, which is applied to the D flip-flop 20 to reset it, resulting in the switch $S_3$ being turned OFF as is the case with the foregoing.

Figure 6:
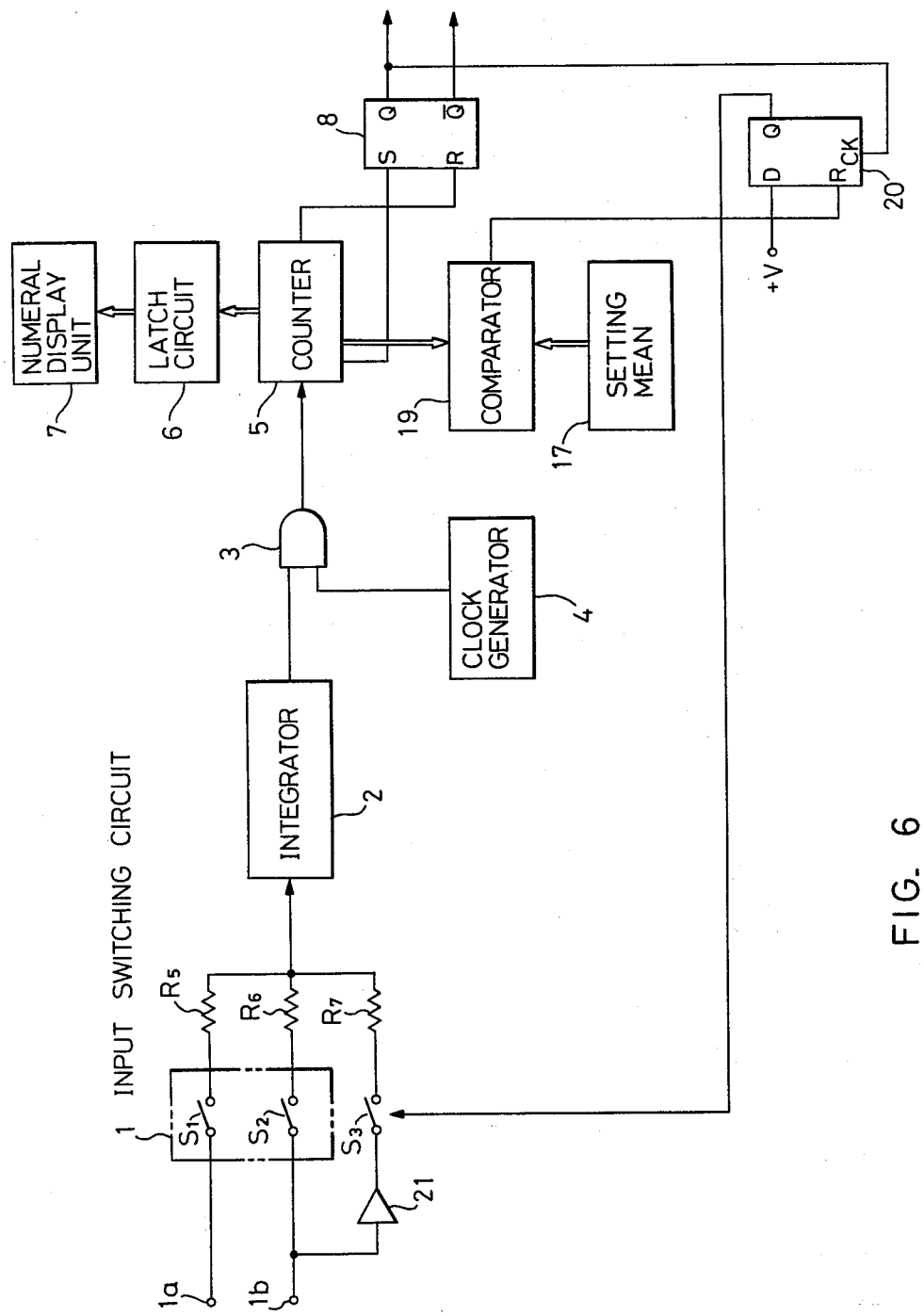
FIG. 6 is a block diagram showing another embodiment of this invention in which a counter for integration use is also employed as a counter of the switch drive signal generating means.

The counters 18a through 18c may also be down-counters, in which case the digital values of the setting means 17 are preset in the counters 18a to 18c, and for each application of a clock pulse to the counter 18a the preset digital values are counted down, and upon generation of a borrow output from the counter 18c the flip-flop 8 is reset. Also, it is possible to use all or part of the counter 5 as the counters 18a through 18c. For example, as shown in FIG. 6, all or part of the count output from the counter 5 ia applied to a comparator 19 for comparison with the digital value set in the setting means 17, and in the case of coincidence the flip-flop 20 is reset.

Figure 7:
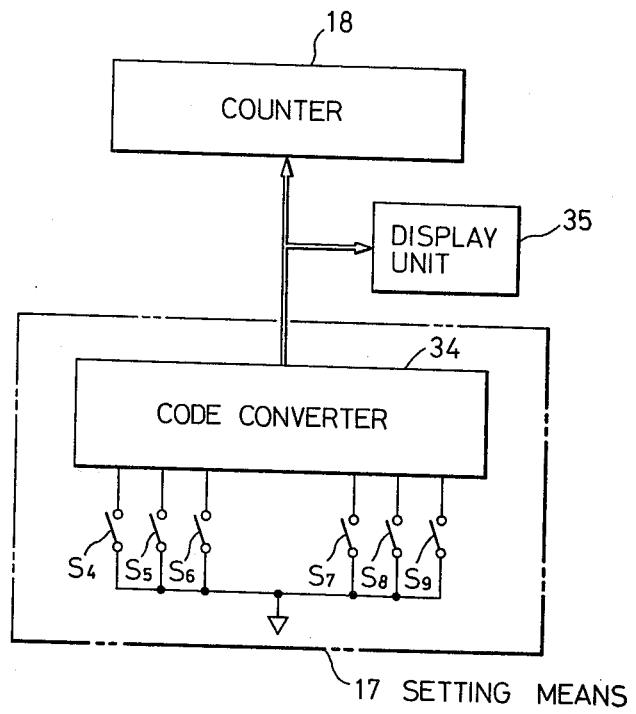
FIG. 7 is a block diagram illustrating another embodiment of this invention which employs a code converter as setting means.

In the case of providing, as the setting means 17, switches, each corresponding to one bit of the set digital value, so-called dip switches may be employed each of which operates for each bit. It is also possible that so-called digital switches, each of which outputs is digital form a numerical value on a rotary member displayed in a display window, are provided corresponding in number to the digits of a required decimal number. In this instance, the switches themselves also serve to display the set digital value. Moreover, not only in the case of setting the digital value directly but also in the case of, for example, converting the output of the thermocouple into digital form as illustrated in FIG. 7, any one of switches $S_4$ to $S_6$ is selectively turned ON according to the kind of thermocouple used, and any one of switches $S_7$ to $S_9$ is selectively turned ON depending on whether the reference junction temperature is set to 273.2, 77.4 or 4.2 K. These switches $S_4$ to $S_9$ are connected to a code converter 34, which yields a digital value corresponding to a combination of the two switches turned ON, and the digital value is supplied as the set digital value to the counter 18. As the code converter 34, a read only memory, for exammple, can be employed; in this case, such arrangement can be made that the set digital value is displayed on a display unit 35.

In the foregoing, the A-D conversion has been described to be controlled in the same manner as set forth, for example, in U.S. Pat. No. 4,110,746 (issued Aug. 29, 1978), but it is also possible to employ such a control system as utilized in U.S. Pat. No. 3,316,547 (issued Apr. 25, 1967), in which case the output pulses from the gate circuit 3 are applied to the counter 18a for counting.

With the present invention, since a constant voltage is superimposed on an analog input voltage for a time corresponding to a set digital value in the first integration period, as described previously, there is no need of selectively supplying various bias voltages; therefore, the A-D converter of the present invention can be produced at low cost without requiring high precision, highly stable and expensive resistors for obtaining such various bias voltages. In this invention, the time width of the switch drive signal depends on the accuracy of input clock pulses to the counter 18, and highly accurate and stable clock pulses are available from the clock pulse generator 4 for A-D conversion use. The A-D converter of the present invention can be obtained by adding the switch drive signal generator 16, the setting means 17 and the switch S₃ to a conventional A-D converter, so that an output digital value of an A-D converter fabricated as a semiconductor integrated circuit can also be corrected with ease. It is also possible to directly set a correction value in the counter 5 from which an output digital value; but in such a case, in order to enable such direct setting of the correction value, it is necessary to connect external terminals to the counter 5. It is necessary to have one external corresponding to one bit of the correction value, and in the case of the A-D converter being fabricated as a semiconductor integrated circuit, it is undesirable that the number of external terminals be large. Further, in the case of performing a non-linear converstion, such as a non-linear compensation in the course of A-D conversion as set forth in the aforesaid U.S. Pat. No. 4,110,746, it cannot easily be known what value should be set in the counter for directly correcting the output digital value. However, in the A-D converter of the present invention in which a constant voltage is superimposed on the analog input voltage for the period of time corresponding to the digital value being set, the input is subjected to a predetermined non-linear A-D conversion, and the required correction value is set as the digital value in the setting means 17.

Figure 8:
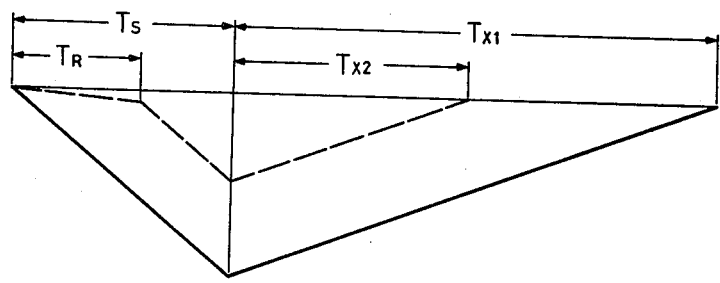
FIG. 8 is a waveform diagram explanatory of an example of the use of the A-D converter of this invention.

In the foregoing embodiments, the reference junction temperature of the thermocouple is changed by setting a digital value in the setting means 17, but the present invention is not limited specifically thereto. For instance, in the field of industrial instrumentation, cases often arise in which measured values are provided as rated current outputs of 4 to to 20 mmA. This invention is also applicable to changing such values of 4 to 20 mmA to 0 1 to 100%. Moreover, when a change in the analog input voltage is relatively small, for example, in the case where the analog input voltage has a value of a five-digit decimal number and its two high order values do not change but only the remaining three low order ones change, digital value or values corresponding to the one or two high order digits are set in the setting means 17, and the constant voltage to be superimposed on the analog input voltage is made opposite thereto in polarity. This permits reduction of the time for A-D conversion. Without such an operation, an analog input voltage is integrated in a first integration period $T_S$ and a second integration period becomes $T_{x1}$, for example, as indicated by the solid lines in FIG. 8. In such a case, by performing the first integration of the analog input voltage so that the constant voltage corresponding to the value of its one high order digit is reduced by digital setting for a period $T_R$, the resulting integrated output becomes smaller in absolute value than that obtainable in the above case, as indicated by the broken line, and since this output is subjected to the second integration, the second integration period becomes $T_{x2}$ shorter than the abovementioned one $T_{x1}$; namely, the A-D conversion period is reduced by that. In this case, for displaying the converted digital value, the value of the above-said one high order digit of the analog input voltage is preset in a display unit and added to a digital output corresponding to the second integration period $T_{x2}$; or the set value of the setting means 17 having set therein the value of the one high order digit is displayed.

Moreover, in the foregoing the voltage which provides a set numerical value is applied via the switch S₃ to the integrator 2 in the first integration period while being superimposed on the analog input voltage, but this is not always necessary; namely, it is also possible, for example, to apply a constant voltage via the switch S₃ to the integrator 2 in the time interval between the first and the second integration period or in some other periods. Further, the voltage to be provided via the switch S₃ to the integrator 2 is described as a voltage that is the polarity inverted voltage of the reference voltage source 9, but if its value is selected to be, for example, ½ of the reference voltage, the numerical value to be added can be reduced to ½ of the set value, and depending on the value of the voltage to be supplied via the switch S₃, the numerical value to be added or subtracted can be altered. Moreover, although the foregoing description has been given in connection with the case where the numerical value to be set has three digits, it can easily be understood that the present invention is not limited specifically thereto.

It will be apparent that many modifications and variations may be effected without departing from the scope of the novel concepts of this invention.

What is claimed is:

1. In an A-D converter having a first switch which is turned on to connect therethrough an analog input voltage which is applied to an integrator for a predetermined period of time to perform first integration of the analog input voltage, having a second switch which is turned on to connect a reference voltage opposite in polarity to the analog input voltage which is applied to the integrator to perform second integration of the reference voltage until the output from the integrator becomes equal to the output at the start of the first integration, wherein the second integration period is converted into an output digital value, the improvement comprising:

setting means for setting a set digital value corresponding to a constant;

switch drive signal generating means, operatively connected to said setting means, for receiving the set digital value set by the setting means and for generating a switch drive signal having a time width corresponding to the set digital value; and switching means, operatively connected to said switch drive signal generating means, for connecting the inverted polarity reference voltage to the integrator, for receiving the switch drive signal and for providing the inverted polarity reference to the integrator in dependence upon the switch drive signal, the inverted polarity reference voltage being provided to the integrator prior to the second integration.

2. An A-D converter according to claim 1, further comprising means for generating clock pulses, wherein the switch drive signal generating means comprises:

a counter, operatively connected to the means for generating clock pulses, for counting the clock pulses from the beginning of the first integration and for generating a count value;

a coincidence circuit, operatively connected to said counter and said setting means, for generating a coincidence signal when there is coincidence between the count value of the counter and the set digital value set by the setting means; and a switch drive signal generator, operatively connected to said coincidence circuit and said switching means, for generating the switch drive signal from the start of the first integration until the generation of the coincidence signal by the coincidence circuit.

3. An A-D converter according to claim 1, further comprising means for generating clock pulses, wherein the switch drive signal generating means comprises:

a presettable down-counter, operatively connected to said setting means and to the means for generating clock pulses, for presetting the set digital value at the beginning of the first integration, for counting down the clock pulses and for generating a count value; and a switch drive signal generator, operatively connected to said presettable down-counter and said switching means, for generating the switch drive signal from the start of the first integration until the count valve of the down-count is counted down to zero.

4. An A-D converter according to claim 1, further comprising means for generating clock pulses, wherein the switch drive signal generating means comprises:

an up-counter, operatively connected to said setting means and the means for generating clock pulses, for presetting the set digital value at the beginning of the first integration, for counting up clock pulses and for generating a carry output; and a switch drive signal generator, operatively connected to said up-counter and switching means, for generating the switch drive signal from the start of the first integration until the carry output is generated by the up-counter.

5. An A-D converter according to claim 2, 3 or 4, wherein the means for generating clock pulses comprises a clock pulse generator incorporated in the A-D converter.

6. An A-D converter according to claim 1, wherein the set setting means comprises setting switches, each corresponding to one bit of the digital value.

7. An A-D converter according to claim 1, wherein the setting means comprises a plurality of setting switches having coded set states and code converting means for converting the coded set states of the setting switches into the set digital value.

8. An A-D converter according to claim 1, wherein the set digital value set by the setting means is a value of a high order digit of the analog input value, wherein the inverted polarity reference voltage is added by the switching means to the analog input voltage in such a manner as to be subtracted therefrom, and wherein there is provided display means for displaying the set digital value of the set high order digit.

9. An A-D converter according to claim 8, wherein the display means is a display unit supplied with the set digital value from the setting means to display the set digital value.

10. An A-D converter according to claim 2, 3 or 4, wherein the counter is also used as a counter for converting the second integration period into the output digital value.

11. An A-D converter, operatively connected to means for generating an analog input voltage, means for generating a reference voltage opposite in polarity to the analog input voltage and means for generating an inverted polarity reference voltage, comprising:

setting means for setting a set digital value corresponding to a constant;

switch drive signal generating means, operatively connected to said setting means, for receiving the set digital value set by the setting means and for generating a switch drive signal having a time width corresponding to the set digital value;

first switch means, operatively connected to the means for generating the analog input voltage, for providing as an output the analog input voltage for a predetermined first integration time period;

a second switch means, operatively connected to the means for generating the reference voltage, for providing as an output the reference voltage during a second integration period;

a third switch means, operatively connected to the means for generating the inverted polarity reference voltage, for providing as an output the inverted polarity reference voltage; and integrator means, operatively connected to said first, second and third switch means, for integrating the outputs of said first, second and third switching means, wherein said third switching means provides said inverted polarity reference voltage to said integrator means prior to the time said second switching means provides said reference voltage to said integrator means during said second integration period and wherein said integrator means integrates said reference voltage during said second integration period until the output from the integrator becomes equal to the output of the start of the first integration period, said integration period being converted into an output digital value.

* * * * *

UNITED STATES PATENT AND TRADEMARK OFFICE
CERTIFICATE OF CORRECTION

PATENT NO. : 4,270,119   Page 1 of 2
DATED : May 26, 1981
INVENTOR(S) : MASAKAZU MITAMURA It is certified that error appears in the above—identified patent and that said Letters Patent is hereby corrected as shown below:

Col. 2, line 54, "to" should be --a--.
Col. 3, line 31, "valve." should be --value.--;
        line 46, "needed," should be --needed;--;
        line 66, "places of decimals" should be --decimal places--.
Col. 4, line 7, "wit" should be --with--;
        line 42, "as" should be --at--;
        line 46, "19c," the "19" should be in heavy type.
Col. 5, line 3, "inthe" should be --in the--;
        line 4, "asbove" should be --above--;
        line 19, "$R_3$" should be --$S_3$--;
        line 20, "ONE" should be --ON--;
        line 29, "intergrator" should be --integrator--;
        line 38, (equation (1)), "$+E_R$" should be --$+E_R \cdot T_R$--.
Col. 6, line 9, "counter." should be --counters.--;
        line 30, after "employed" insert --,--;
        line 32, "is" should be --in--;
        line 50, "exammple" should be --example--.

UNITED STATES PATENT AND TRADEMARK OFFICE
CERTIFICATE OF CORRECTION

PATENT NO. : 4,270,119
DATED : May 26, 1981
INVENTOR(S) : MASAKAZU MITAMURA

It is certified that error appears in the above—identified patent and that said Letters Patent is hereby corrected as shown below:

```
Col. 7, line 16, after "external" insert --terminal--;
        line 21, "converstion" should be --conversion--;
        line 40, "0 1 to" should be --0 to-- (ordinary type);
        line 68, ";" should be --,--.
Col. 9, line 20, "valve" should be --value--, and "-count"
        should be -- -counter--;
        line 40, delete "set";
        line 41, after "the" insert --set--.
```

Signed and Sealed this

Seventeenth Day of November 1981

[SEAL]

*Attest:*

*Attesting Officer*

GERALD J. MOSSINGHOFF

*Commissioner of Patents and Trademarks*